(12) United States Patent
Hara

(10) Patent No.: US 7,697,367 B2
(45) Date of Patent: Apr. 13, 2010

(54) SEMICONDUCTOR MEMORY DEVICE WITH REDUCED CURRENT CONSUMPTION

(75) Inventor: Kota Hara, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 103 days.

(21) Appl. No.: 12/146,962

(22) Filed: Jun. 26, 2008

(65) Prior Publication Data
US 2009/0092000 A1    Apr. 9, 2009

(30) Foreign Application Priority Data
Aug. 10, 2007    (JP) ................ 2007-209833

(51) Int. Cl.
*G11C 11/00*    (2006.01)

(52) U.S. Cl. ............... 365/230.06; 365/189.05

(58) Field of Classification Search ............ 365/230.06, 365/189.05
See application file for complete search history.

(56) References Cited

U.S. PATENT DOCUMENTS

| | | | | |
|---|---|---|---|---|
| 5,295,106 A | * | 3/1994 | Jinbo | .......................... 365/218 |
| 5,687,121 A | * | 11/1997 | Lee et al. | ................ 365/185.11 |
| 5,764,589 A | * | 6/1998 | Lotfi | ...................... 365/230.06 |
| 5,999,479 A | * | 12/1999 | Park et al. | .............. 365/230.06 |
| 6,097,636 A | * | 8/2000 | Nojima | ................... 365/185.23 |
| 6,285,593 B1 | * | 9/2001 | Wong | .................... 365/185.23 |
| 6,388,472 B1 | * | 5/2002 | Kang | ......................... 326/106 |
| 6,567,287 B2 | * | 5/2003 | Scheuerlein | ................. 365/51 |
| 7,298,665 B2 | * | 11/2007 | So et al. | ................ 365/230.06 |
| 7,447,105 B2 | * | 11/2008 | Lee | ....................... 365/230.06 |

FOREIGN PATENT DOCUMENTS

JP    2000-149564 A    5/2000

* cited by examiner

*Primary Examiner*—Michael T Tran
(74) *Attorney, Agent, or Firm*—ArentFox LLP

(57) ABSTRACT

A semiconductor memory device includes memory blocks, a main word decoder to set a main word line to a first potential for activation, a second potential, or a third potential, a circuit to generate a cyclic signal that indicates timing at intervals, a block selecting circuit to select a memory block to be accessed, a successive-selection circuit to select the memory blocks one after another, and a circuit configured to control the main word decoder such that unselected ones of the main word lines of a memory block selected by the block selecting circuit are set to the third potential, such that the main word lines of the selected memory block are maintained at the third potential after access, and such that the main word lines of a memory block selected by the successive-selection circuit are set to the second potential at the timing indicated by the cyclic signal.

19 Claims, 13 Drawing Sheets

SEMICONDUCTOR MEMORY DEVICE WITH REDUCED CURRENT CONSUMPTION

CROSS-REFERENCE TO RELATED APPLICATIONS

The present application is based upon and claims the benefit of priority from the prior Japanese Patent Application No. 2007-209833 filed on Aug. 10, 2007, with the Japanese Patent Office, the entire contents of which are incorporated herein by reference.

BACKGROUND OF THE INVENTION

1. Field of the Invention

The disclosures herein generally relate to semiconductor memory devices, and particularly relates to a semiconductor memory device in which word lines are organized into a hierarchical structure including main word lines and sub-word lines.

2. Description of the Related Art

In a DRAM (dynamic random access memory) that stores data as electric charge accumulated in memory cells comprised of capacitors, there is a need to supply a boost voltage VPP higher than a HIGH level to word lines in order to reliably store the HIGH level in the memory cells at high speed. Further, a negative voltage VNN lower than a ground potential VSS is generally applied to non-selected word lines for the purpose of avoiding leak currents in transistors.

In DRAMs having word lines organized in a hierarchical structure including main word lines and sub-word lines, a selected sub-word line is set to VPP, and unselected sub-word lines are set to VNN. A selected main word line is set to VNN, and unselected main word lines are set to VPP.

FIG. 1 is a drawing showing an example of the circuit configuration of a main word decoder and sub-word decoder. A main word decoder 10 includes PMOS transistors 11 through 13, an NMOS transistor 14, and an inverter 15. A single circuit portion comprised of the PMOS transistors 11 and 12 and the inverter 15 is provided in the main word decoder 10. A plurality (n: integer greater than one) of circuit portions each comprised of the PMOS transistor 13 and the NMOS transistor 14 are provided in the main word decoder 10, so that the main word decoder 10 can drive n main word lines MWL. A memory cell array and peripheral circuit are generally divided into a plurality of memory blocks demarcated according to row addresses. One main word decoder 10 is provided for one memory block.

A signal applied to the gates of the PMOS transistor 13 and NMOS transistor 14 in the main word decoder 10 is a decode signal for selecting a main word line MWL. This decode signal is generated by decoding a row address. At the time of memory access, a decode signal corresponding to a main word line MWL to be selectively activated is set to HIGH.

A sub-word decoder 20 includes a PMOS transistor 21, NMOS transistors 22 and 23, and an inverter 24. For the sake of clarity of illustration, only one sub-word decoder 20 connected to a main word line MWL is shown in FIG. 1. In an actual circuit configuration, however, a plurality (m: integer greater than one) of sub-word decoders 20 corresponding to m row addresses are connected to a single main word line MWL. Further, m sub-word decoders 20 constitute a single set, and a plurality of such sets are connected to a main word line MWL at respective positions in the direction of its extension.

In order to access a selected row address, the main word decoder 10 corresponding to a selected memory block belonging to the selected row address selects a main word line MWL corresponding to the selected row address, and sets the selected main word line MWL to VNN. Further, a sub-word decoder 20 corresponding to the selected row address is selected from the m sub-word decoders 20 connected to a corresponding main word line MWL, followed by setting a signal SO to VPP in this selected sub-word decoder 20. With these settings, the PMOS transistor 21 of the selected sub-word decoder 20 connected to the selected main word line MWL is made conductive to set the potential of a sub-word line SWL to VPP.

In the above-noted main word decoder 10 corresponding to the selected memory block, all the unselected main word lines MWL are set to VPP. With such setting, the PMOS transistor 21 is made nonconductive in the selected sub-word decoders 20 connected to an unselected main word line MWL where the signal SO is set to VPP. In these selected sub-word decoders 20, the NMOS transistor 22 becomes conductive to set the sub-word line SWL to VNN.

In unselected sub-word decoders 20, the signal SO is set to VSS. The output of the inverter 24 is thus set to HIGH to make the NMOS transistor 23 conductive to set the potential of the sub-word line SWL to VNN. In this case, the potential of the sub-word line SWL is VNN regardless of the potential of the main word line MWL (which is either VPP or VNN).

The above description concerns the operation of an activated memory block. In an inactive memory block (i.e., placed in a standby state), all the main word lines MWL are set to VII. The HIGH/LOW state of a signal GIDLCTL controls whether the potential of an inactive (unselected) main word line MWL is set to VII or VPP. The HIGH state of the signal GIDLCTL causes the PMOS transistor 11 to become conductive to select VII whereas the LOW state of the signal GIDLCTL causes the PMOS transistor 12 to become conductive to select VPP. Here, VII is a potential lower than the boost potential VPP, and is generally lower than the power supply voltage VDD applied to the semiconductor memory device.

In the following, for the sake of argument, it is assumed that all the main word lines MWL in an inactive (unselected) memory block are set to VPP. In such a case, the boost potential VPP continues to be applied to the gate of the PMOS transistor 21 in the sub-word decoders 20. When a difference in potential between the drain potential VNN and gate potential VPP of the PMOS transistor 21 is large, a leak current between the source/drain and the well increases, resulting in an increase in current consumption in this inactive (i.e., standby-state) memory block. In order to suppress this leak current, the gate potential of the PMOS transistor 21 is lowered from VPP to VII in inactive memory blocks.

Setting the main word lines MWL to VII in an inactive memory block necessitates an operation by which the potential of the main word lines MWL is increased from VII to VPP upon selecting and activating a memory block at the time of access. This operation serves as a factor to cause current consumption. There may be a case in which a memory block is selectively activated, and is then deactivated immediately after access operation to lower the potential of the main word lines MWL to VII. Another access may occur with respect to this memory block immediately thereafter, thereby consuming an electric current to increase the potential from VII to VPP. It is thus not desirable to create frequent current consumptions by dropping the potential from VPP to VII after each access operation in a memory block that is frequently accessed.

FIG. 2 is a drawing for explaining changes in the potential of a main word line MWL. In an initial state, the memory block of interest is inactive, so that the main word lines MWL are set to VII. Upon start of an operation to access a row address belonging to this memory block of interest, the signal GIDLCTL shown in FIG. 1 is set to HIGH, so that all the main word lines MWL of this memory block are set to VPP. After this, a main word line MWL corresponding to the row address to be accessed is selected and set to VNN. FIG. 2 shows the potential level of this selected main word line MWL.

After the selection of the main word line MWL, the signal SO is changed from VSS to VPP with respect to the sub-word decoders 20 corresponding to the accessed row address. This causes the potential of the sub-word line SWL to change from the unselected potential VNN to the selected active potential VPP. The VPP level of the sub-word line SWL serves to write data to memory cells. The signal So is thereafter changed from VPP to VSS in the sub-word decoders 20, resulting in the potential of the sub-word line SWL being changed from VPP to VNN. The potential of the selected main word line MWL then returns from VNN to VPP. In this state, all the main word lines MWL in the block of interest are set to VPP.

In the example shown in FIG. 2, the potential of all the main word lines MWL are dropped from VPP to VII after the completion of an access operation. This serves to reduce a leak current through the PMOS transistor 21. However, it is undesirable to drop the potential of the main word lines MWL from VPP to VII after each access operation because such drop creates current consumption at every access.

It is conceivable to maintain the potential of the main word lines MWL at VPP for some time period in an accessed memory block after the access operation in order to avoid the occurrence of current consumption at every access due to an increase of potential from VII to VPP. With this arrangement, there is no need to increase the potential of the main word lines MWL from VII to VPP each time this memory block is accessed, thereby reducing excessive current consumption. Keeping the potential of the main word lines MWL at VPP, however, creates another concern that current consumption caused by a leak current through the PMOS transistor 21 cannot be ignored. It is further conceivable to maintain the potential of the main word lines MWL at VPP in memory blocks and then to drop the potential of the main word lines MWL to VII with respect to each memory block for which a refresh operation is completed as refresh operations are successively performed with respect to the memory blocks in a standby state.

FIG. 3 is a drawing for explaining the dropping of the potential of the main word lines MWL with respect to each memory block upon the completion of a refresh operation. FIG. 3 illustrates an example in which 4 memory blocks BLK0 through BLK3 are provided. An active period for memory access appears first, followed by a standby period in which no memory access is performed. Each row in FIG. 3 shows whether the potential of the main word lines MWL are VPP or VII with respect to a corresponding one of the memory blocks BLK0 through BLK3.

In FIG. 3, a first access operation in the active period is a read operation (RD-BLK0) with respect to the memory block BLK0. As a result of this access operation, the potential of the main word lines MWL are set to VPP in the memory block BLK0, and are maintained at VPP even after this access operation. A second access operation in the active period is a read operation (RD-BLK2) with respect to the memory block BLK2. As a result of this access operation, the potential of the main word lines MWL are set to VPP in the memory block BLK2, and are maintained at VPP even after this access operation.

In the standby period, the memory blocks BLK0 through BLK3 are successively refreshed. This may be a refresh operation automatically performed within the DRAM. In a period designated as REFxWL-BLK0, all the sub-word lines SWL are successively selected and refreshed in the memory block BLK0. After the completion of these refresh operations for this memory block, the potential of all the main word lines MWL of the memory block BLK0 is dropped from VPP to VII. In a period designated as REFxWL-BLK1, thereafter, all the sub-word lines SWL are successively selected and refreshed in the memory block BLK1. The memory block BLK1 is activated for these refresh operations, and all the main word lines MWL are set to VPP. After the completion of these refresh operations for this memory block, the potential of all the main word lines MWL of the memory block BLK1 is dropped from VPP to VII.

In a period designated as REFxWL-BLK2, all the sub-word lines SWL are successively selected and refreshed in the memory block BLK2. After the completion of these refresh operations for this memory block, the potential of all the main word lines MWL of the memory block BLK2 is dropped from VPP to VII. In a period designated as REFxWL-BLK3, further, all the sub-word lines SWL are successively selected and refreshed in the memory block BLK3. The memory block BLK3 is activated for these refresh operations, and all the main word lines MWL are set to VPP. After the completion of these refresh operations for this memory block, the potential of all the main word lines MWL of the memory block BLK3 is dropped from VPP to VII.

Through the operations shown in FIG. 3 as described above, it is possible to eliminate the excessive current consumption operation that increases the potential of the main word lines MWL from VII to VPP each time a memory block is accessed. At the same time, the current consumption caused by leak currents in inactive memory blocks can be reduced to some exent. The above-described operations, however, may not be effective in terms of its advantageous effect of reducing leak currents in inactive memory blocks when the memory blocks are accessed in a particular manner.

FIG. 4 is a drawing for explaining a case in which the effect of reducing leak currents is not sufficient when dropping the potential of the main word lines MWL with respect to each memory block upon the completion of a refresh operation. In the example shown in FIG. 4, access operations are successively performed with respect to the memory blocks BLK0 through BLK3, resulting in the main word lines MWL being maintained at VPP in all the memory blocks BLK0 through BLK3.

In the standby period in which no memory access is performed, the memory blocks BLK0 through BLK3 are successively refreshed. This may be a refresh operation automatically performed within the DRAM as previously described. In the same manner as in FIG. 3, after the completion of refresh operations for a given memory block, the potential of all the main word lines MWL of this memory block is dropped from VPP to VII.

When operations are performed in the manner as shown in FIG. 4, the period in which the main word lines MWL are set to VPP in all the memory blocks continues for some time. During this period, the effect of reducing leak currents in inactive memory blocks is nonexistent. Even after the successive refresh operations for the memory blocks BLK0 through BLK3 are started, the main word lines MWL continue to be at VPP in at least one of the memory blocks until all the sub-word lines SWL of all the memory blocks are refreshed. The period required to refresh all the sub-word lines SWL of all the memory blocks is shown as tREF in FIG. 4. There may be a case in which a standby period continues for a duration substantially equal to tREF, immediately followed by an active period in which random memory accesses occur in such a manner as to access addresses evenly across the memory space, and further followed by a standby period lasting for a duration substantially equal to tREF. In such a case, the effect of leak current reduction will be extremely small.

Accordingly, there is a need for a semiconductor memory device that can eliminate the excessive current consumption operation that increases the potential of main word lines each time a memory block is accessed while sufficiently maintaining the effect of leak current reduction in inactive memory blocks.

[Patent Document 1] Japanese Patent Application Publication No. 2000-149564

SUMMARY OF THE INVENTION

According to an embodiment, a semiconductor memory device includes a plurality of memory blocks each including main word lines and sub-word lines, a main word decoder configured to set a selected main word line to a first potential and to set an unselected main word line to one of a second potential and a third potential, a cyclic signal generating circuit configured to generate a cyclic signal that indicates timing at predetermined intervals, a block selecting circuit configured to select a memory block to be accessed, a successive-selection circuit configured to successively select the memory blocks one after another, and a word decoder control circuit configured to control the main word decoder such that at least unselected one of the main word lines of a memory block selected by the block selecting circuit is set to the third potential, such that the main word lines of the selected memory block are maintained at the third potential after an access operation, and such that the main word lines of a memory block being selected by the successive-selection circuit are set to the second potential at the timing indicated by the cyclic signal.

According to another embodiment, a method of controlling a word decoder is provided for a semiconductor memory device including a plurality of memory blocks each including main word lines and sub-word lines, a main word decoder configured to set a selected main word line to a first potential and to set an unselected main word line to one of a second potential and a third potential, and a block selecting circuit configured to select a memory block to be accessed. The method includes the steps of generating a cyclic signal that indicates timing at predetermined intervals, generating a successive-selection signal that successively selects the memory blocks one after another, and controlling the main word decoder such that at least unselected one of the main word lines of a memory block selected by the block selecting circuit is set to the third potential, such that the main word lines of the selected memory block are maintained at the third potential after an access operation, and such that the main word lines of a memory block being selected by the successive-selection signal are set to the second potential at the timing indicated by the cyclic signal.

According to at least one embodiment, signals having proper timings are used as cyclic signals for resetting memory blocks while taking into account balance between the effect of leak current reduction and the consumption of current associated with an increase in the potential of main word lines. Such arrangement serves to eliminate the excessive current consumption operation that increases the potential of main word lines each time a memory block is accessed, while sufficiently maintaining the effect of leak current reduction in inactive memory blocks.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 5:
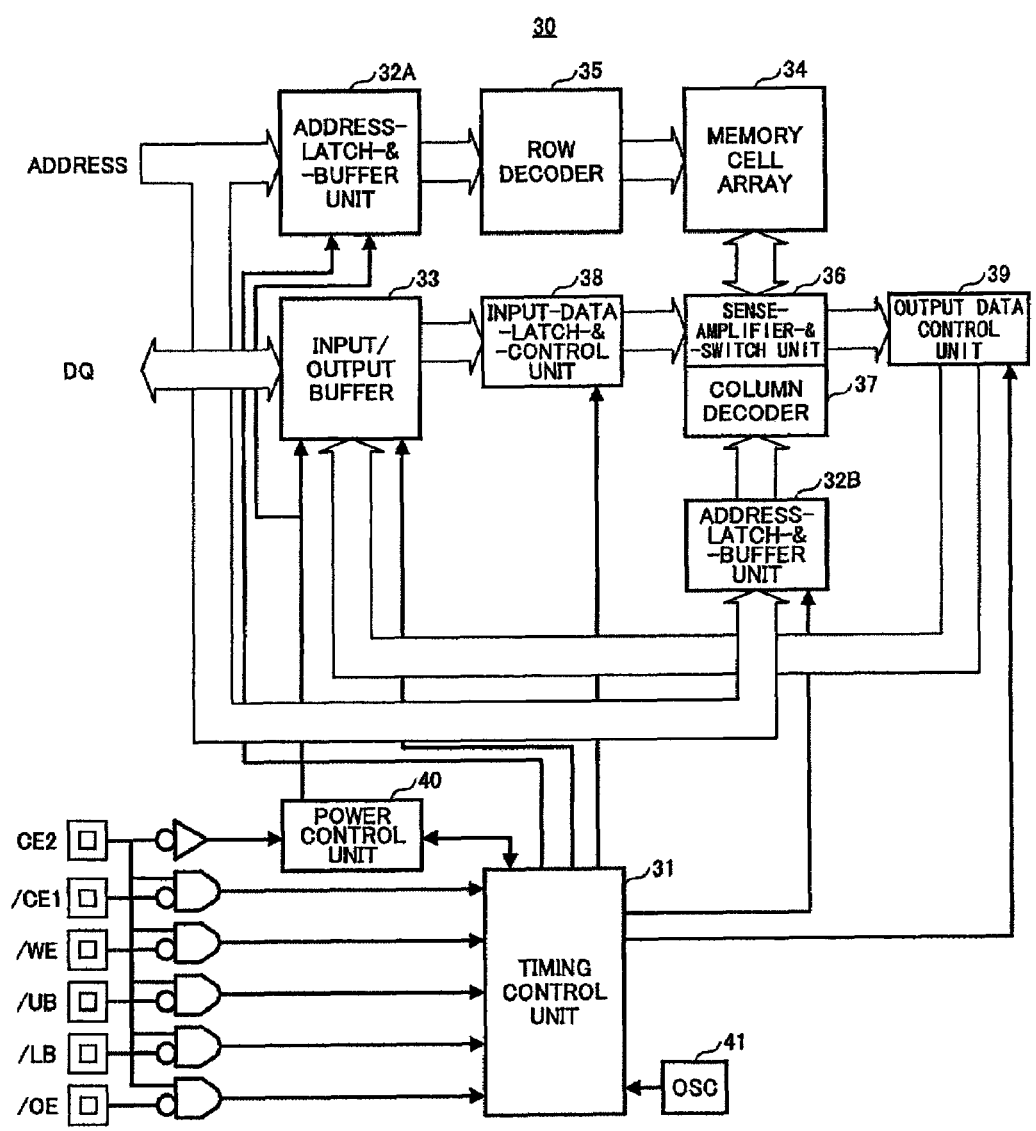
FIG. 5 is a drawing showing an example of the configuration of a semiconductor memory device according to an embodiment.

FIG. 5 is a drawing showing an example of the configuration of a semiconductor memory device according to an embodiment. What is shown in FIG. 5 is an example of the configuration of a semiconductor memory device. A semiconductor memory device 30 shown in FIG. 5 includes a timing control unit 31, an address-latch-&-buffer unit 32A, an address-latch-&-buffer unit 32B, an input/output buffer 33, a memory cell array 34, a row decoder 35, a sense-amplifier-&-switch unit 36, a column decoder 37, an input-data-latch-&-control unit 38, an output data control unit 39, a power control unit 40, and an oscillator (OSC) 41.

The timing control unit 31 receives control signals indicative of various commands from an external device outside the semiconductor memory device 30. These control signals include a chip enable signal/CE1, a write enable signal/WE, a data-byte control signal/UB, a data-byte control signal/LB, and an output enable signal/OE. The chip enable signal/CE2 controls the reception of these control signals, and also controls whether the power control unit 40 is activated or deactivated. In response to the chip enable signal/CE2, the power control unit 40 activates the timing control unit 31, the address-latch-&-buffer unit 32A, and the input/output buffer 33.

The timing control unit 31 further receives an oscillating signal from the oscillator 41. Based on the control signals and the oscillating signal, the timing control unit 31 generates various control signals and timing signals corresponding to operations (e.g., data read operation, data write operation, and the like) specified by the decode results of the control signals. These control signals and timing signals are supplied to relevant circuit units such as the address-latch-&-buffer unit 32A, the address-latch-&-buffer unit 32B, the input/output buffer 33, the input-data-latch-&-control unit 38, the output data control unit 39, and the power control unit 40. Each circuit unit operates in accordance with these control signals and timing signals.

The timing control unit 31 generates a refresh timing signal comprised of a series of pulses arranged at constant intervals in response to the oscillating signal from the oscillator 41. Each pulse of the refresh timing signal is supplied to a refresh address counter that may be provided in the timing control unit 31, for example. The refresh address counter generates a refresh address signal in response to each pulse of the refresh timing signal. The refresh address signal is supplied to the row decoder 35 via the address-latch-&-buffer unit 32A, for example. With this arrangement, refresh operations are performed with respect to refresh addresses.

The address-latch-&-buffer unit 32A receives an address signal indicative of a row address from an external device outside the semiconductor memory device 30. The received row address is supplied to the row decoder 35. The address-latch-&-buffer unit 32B receives an address signal indicative of a column address from the external device outside the semiconductor memory device 30. The received column address is supplied to the column decoder 37.

In the memory cell array 34, a plurality of memory cells are arranged in a matrix form extending in a row direction and a column direction to constitute a cell array. Each memory cell stores data. The memory cell array 34 includes a plurality of word lines corresponding to a plurality of row addresses, and a plurality of memory cells are coupled to each word line. A plurality of bits lines are arranged in a direction in which column addresses are arranged, and are coupled to the sense-amplifier-&-switch unit 36.

The row decoder 35 decodes a row address supplied from address-latch-&-buffer unit 32A, and selectively activates a word line specified by the row address. The column decoder 37 decodes a column address supplied from the address-latch-&-buffer unit 32B, and selectively activates a column selecting line specified by the column address.

Data stored in memory cells connected to an activated word line are read to the bit lines and amplified by the sense-amplifier-&-switch unit 36. In the case of read operation, the data amplified by the sense-amplifier-&-switch unit 36 is subjected to selection by an activated column selecting line, and the selected data is output to outside the semiconductor memory device 30 via the output data control unit 39 and the input/output buffer 33. In the case of write operation, write data is supplied from an external device outside the semiconductor memory device 30 via the input/output buffer 33 and the input-data-latch-&-control unit 38, and is written to the sense-amplifier-&-switch unit 36 at the column address selected by an activated column selecting line. This write data and the data that were read from memory cells and ought to be restored are written to the memory cells connected to an activated word line.

Figure 1:
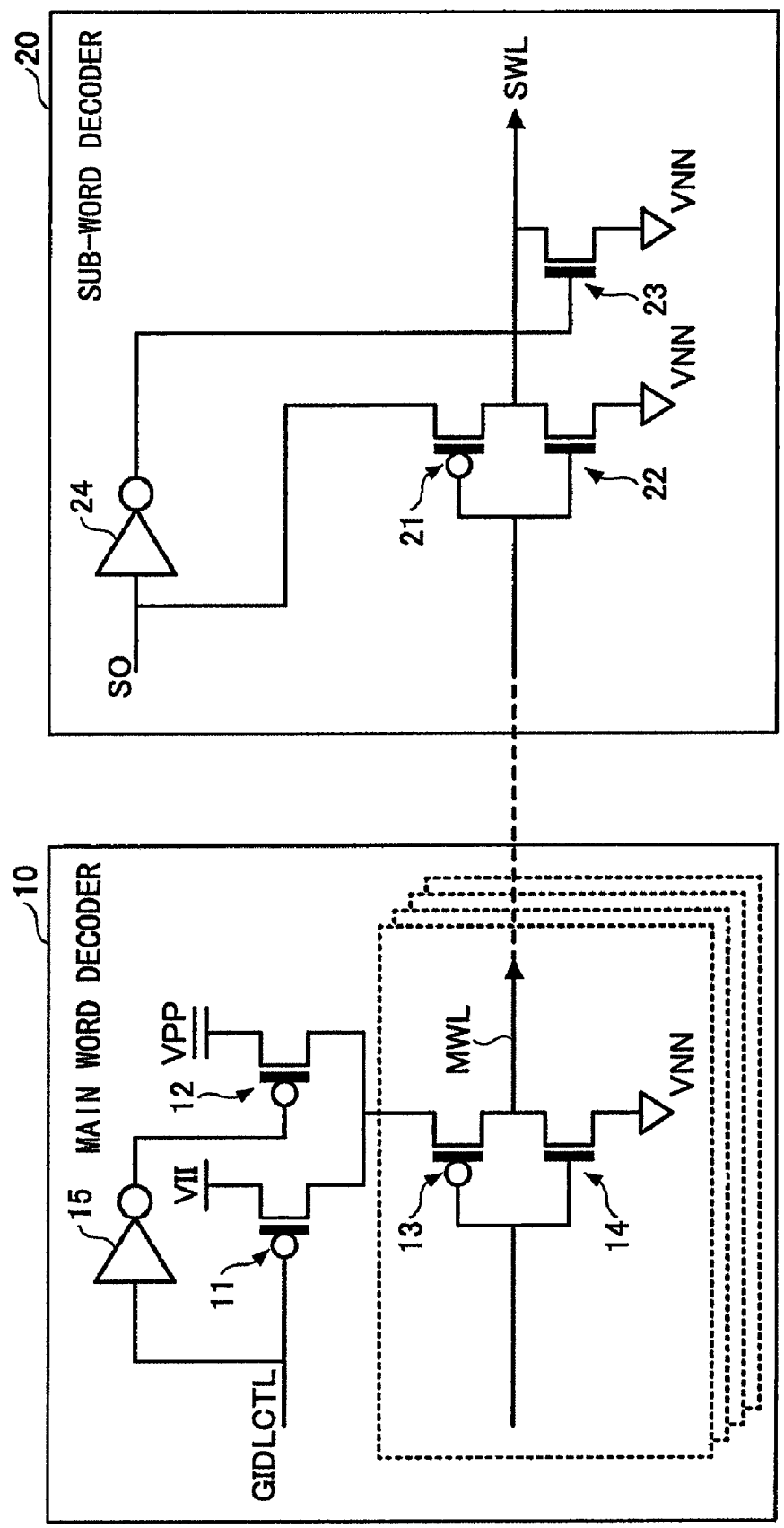
FIG. 1 is a drawing showing an example of the circuit configuration of a main word decoder and sub-word decoder.
Figure 2:
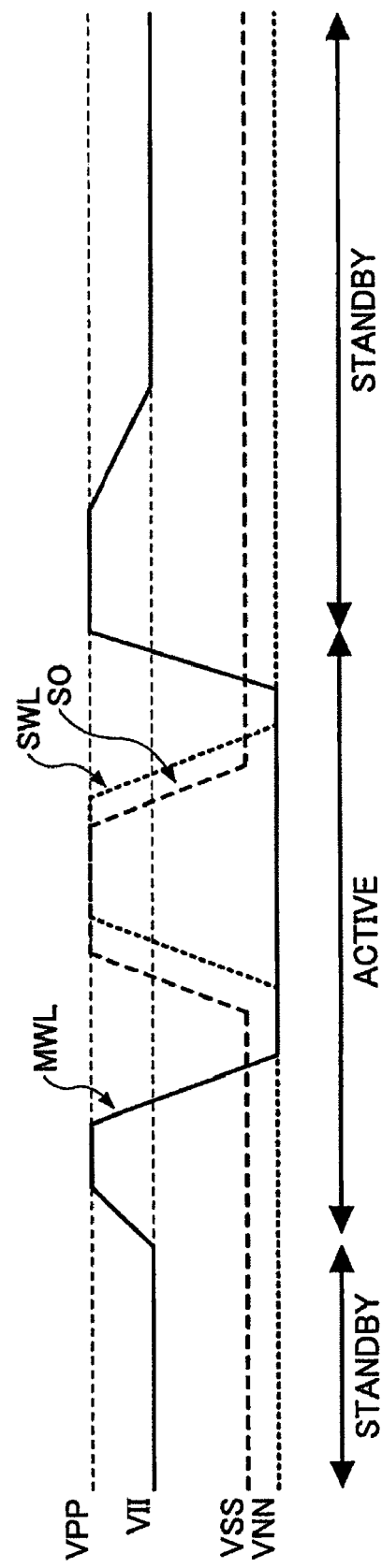
FIG. 2 is a drawing for explaining changes in the potential of a main word line.
Figure 3:
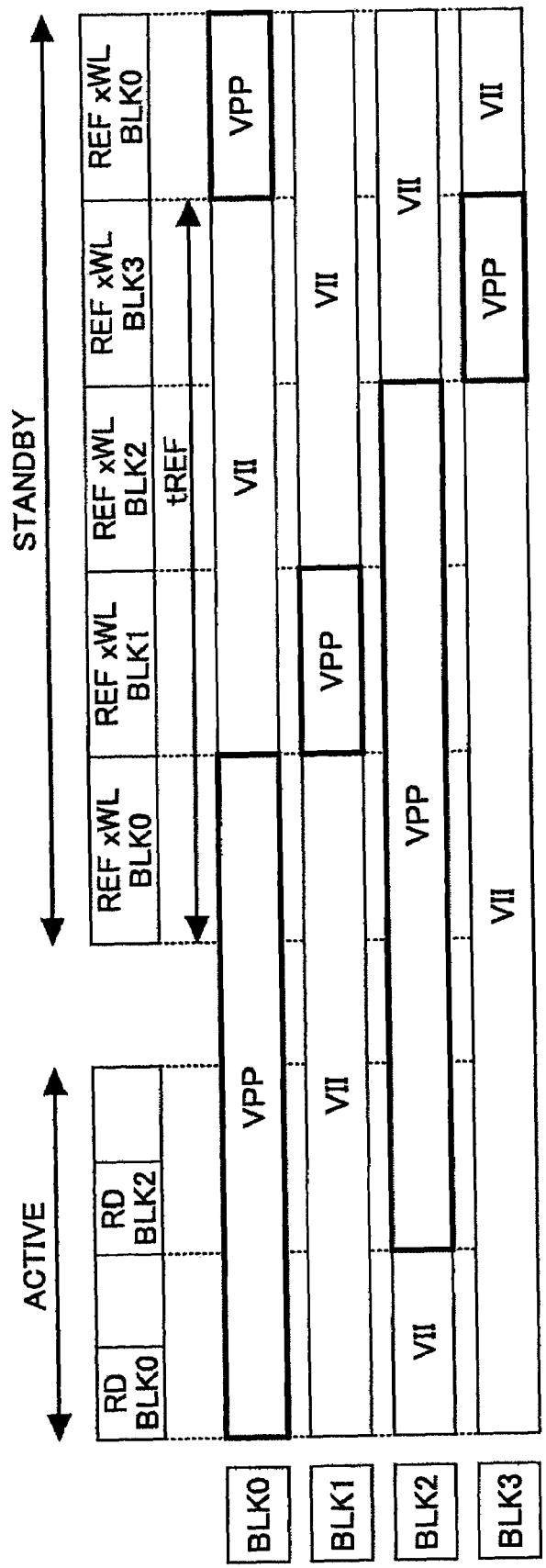
FIG. 3 is a drawing for explaining the dropping of the potential of main word lines with respect to each memory block upon the completion of a refresh operation.
Figure 6:
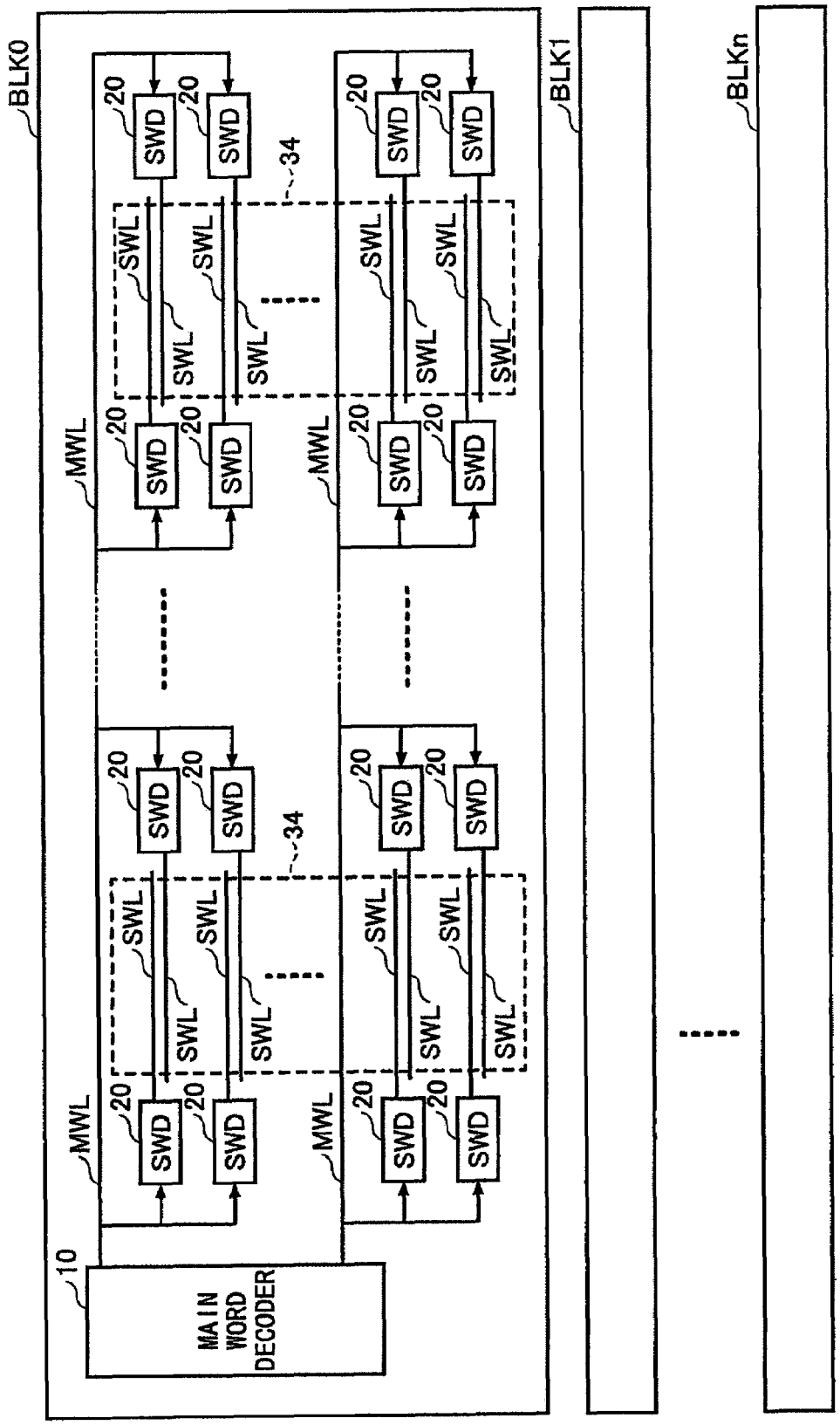
FIG. 6 is a drawing showing the configuration of memory blocks with respect to a memory cell array and peripheral circuit of the semiconductor memory device.

FIG. 6 is a drawing showing the configuration of memory blocks with respect to the memory cell array 34 and peripheral circuit of the semiconductor memory device 30. In FIG. 6, the same elements as those of FIG. 1 are referred to by the same numerals, and a description thereof will be omitted.

The memory cell array 34 and peripheral circuit (row decoder 35) of the semiconductor memory device 30 are divided into a plurality of memory blocks BLK0 through BLKn demarcated according to row addresses. Although FIG. 6 shows only the configuration of the memory block BLK0, the remaining memory blocks BLK1 through BLKn have a configuration substantially the same as that of the memory block BLK0.

One main word decoder 10 is provided for one memory block. The main word decoder 10 has a circuit configuration as shown in FIG. 1. The main word decoder 10 drives a plurality of main word lines MWL. A single main word line MWL is connected to a plurality (m: integer greater than one, which is equal to 4 in the example shown in FIG. 6) of sub-word decoders 20 corresponding to m row addresses. Further, m sub-word decoders 20 constitute a single set, and a plurality of such sets are connected to a main word line MWL at respective positions in the direction of its extension. Sub-word lines SWL extending from the sub-word decoders 20 are coupled to the memory cells (not shown) of the memory cell array 34.

FIG. 6 illustrates a memory block as a block that includes the main word decoder 10, the sub-word decoders 20, the main word lines MWL, the sub-word lines SWL, and the memory cell array 34. It should be noted, however, that what constitutes a memory block and what is outside the memory block may only be a matter of choice that is decided by taking into account the convenience of explanation. For example, a memory block may be regarded as a block including main word lines MWL, sub-word lines SWL, and the memory cell array 34, and peripheral circuits relating to decoding (i.e., the main word decoder 10 and the sub-word decoder 20) may be regarded as circuits outside the memory block.

In order to access a selected row address, the main word decoder 10 corresponding to a selected memory block belonging to the selected row address selects a main word line MWL corresponding to the selected row address, and sets the selected main word line MWL to VNN. Further, a sub-word decoder 20 corresponding to the selected row address is selected from the m sub-word decoders 20 connected to a corresponding main word line MWL, followed by setting a signal SO to VPP in this selected sub-word decoder 20 (see FIG. 1). With these settings, the potential of the sub-word line SWL connected to the selected sub-word decoder 20 connected to the selected main word line MWL is set to VPP. In the main word decoder 10 corresponding to the selected memory block, all the unselected main word lines MWL are set to VPP. With these settings, the potential of the sub-word line SWL is set to VNN in the selected sub-word decoders 20 connected to the unselected main word lines MWL.

In unselected sub-word decoders 20, the signal SO is set to VSS (see FIG. 1). As a result, the potential of the sub-word lines SWL is set to VNN. In this case, the potential of the sub-word line SWL is VNN regardless of the potential of the main word line MWL (which is either VPP or VNN).

The above description concerns the operation of an activated memory block. In an inactive memory block (i.e., placed in a standby state), all the main word lines MWL are generally set to VII. Here, VII is a potential lower than the boost potential VPP, and is generally lower than the power supply voltage VDD applied to the semiconductor memory device.

In the semiconductor memory device 30 according to the present embodiment, the main word lines MWL of an accessed memory block are maintained at VPP for some time period after access to the memory block. With this arrangement, there is no need to increase the potential of the main word lines MWL from VII to VPP each time this memory block is accessed, thereby reducing excessive current consumption. Keeping the potential of the main word lines MWL at VPP, however, creates another concern that current consumption caused by a leak current through the PMOS transistor 21 cannot be ignored. In consideration of this, while the main word lines MWL are maintained at VPP in an accessed memory block following an access operation, the main word lines MWL of a memory block currently unselected are dropped to VII at predetermined timing.

Figure 4:
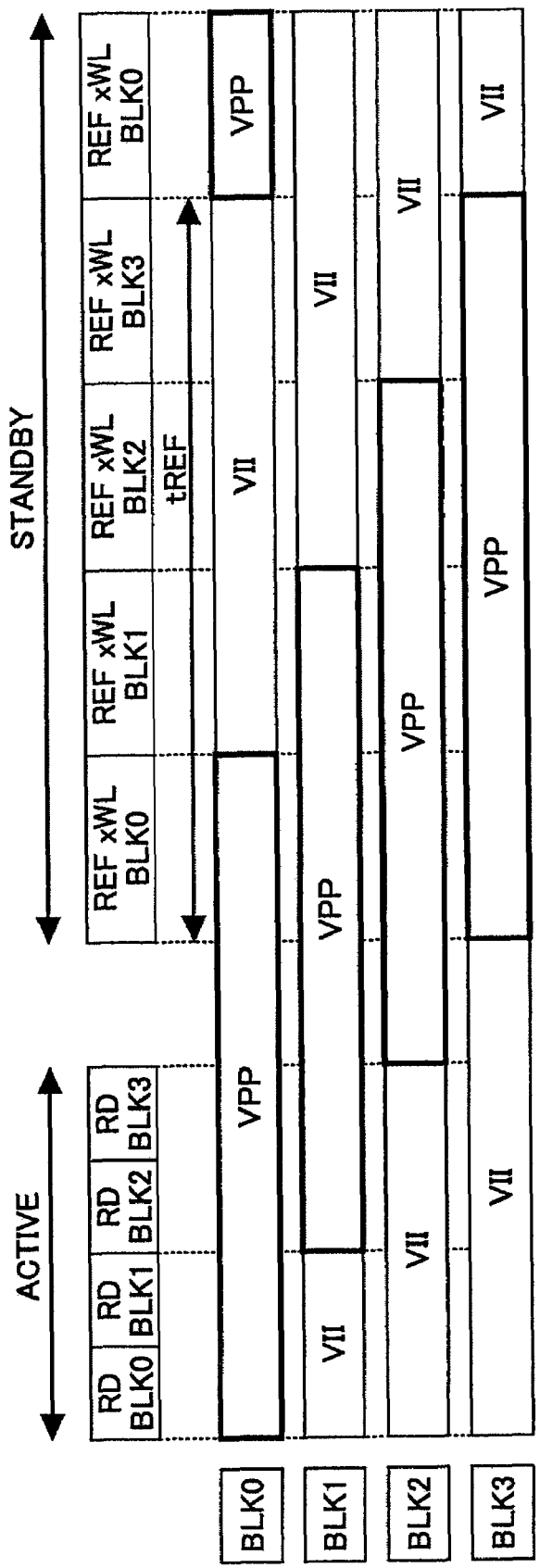
FIG. 4 is a drawing for explaining a case in which the effect of reducing leak currents is not sufficient when dropping the potential of the main word lines with respect to each memory block upon the completion of a refresh operation.
Figure 7:
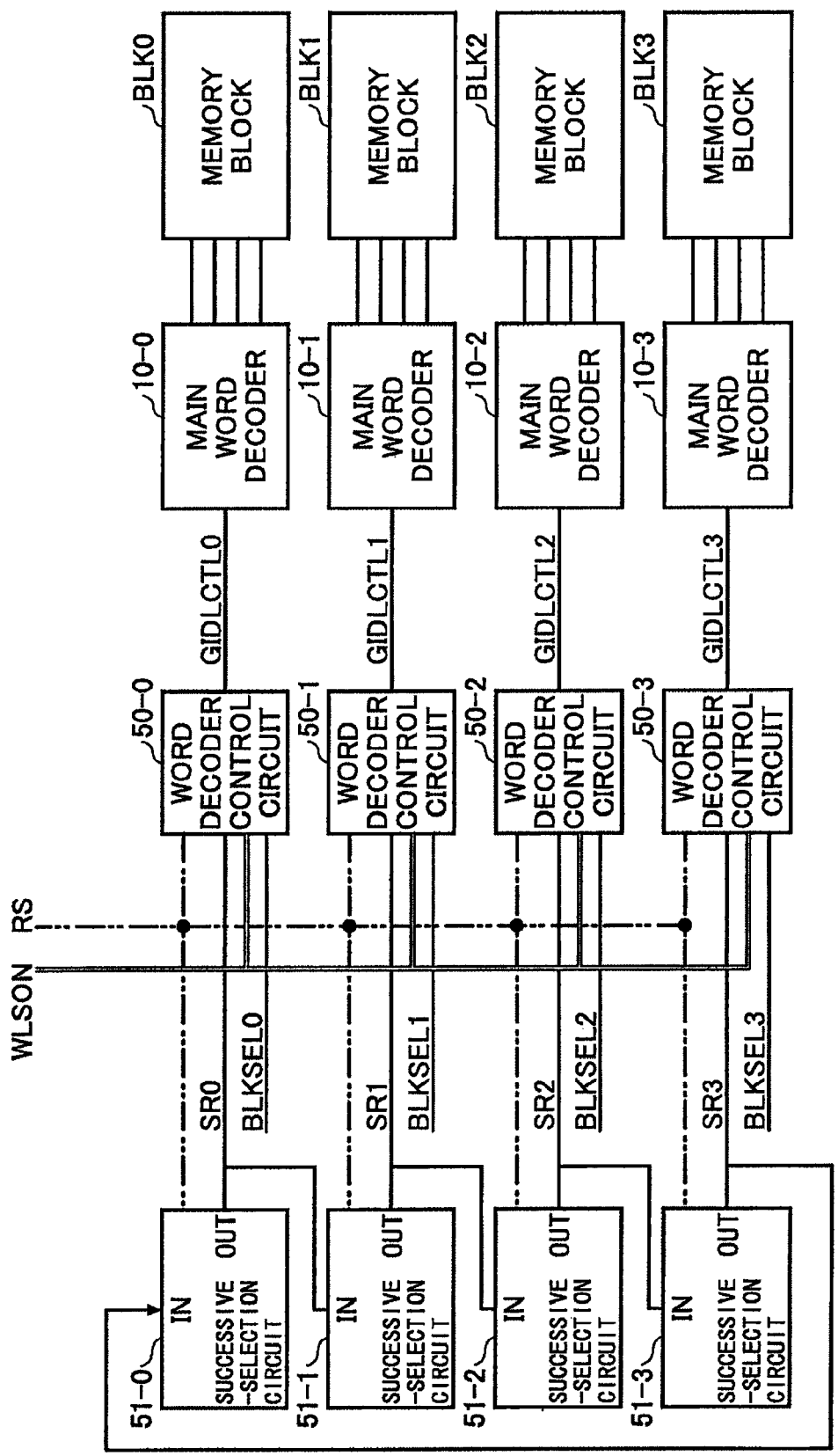
FIG. 7 is a drawing showing an example of a configuration that controls main word decoders in a plurality of memory blocks.

FIG. 7 is a drawing showing an example of a configuration that controls main word decoders in a plurality of memory blocks. Although FIG. 4 is directed to an example in which 4 memory blocks are provided, the number of memory blocks may be any number greater than one.

Main word decoders 10-0 through 10-3 are provided in one-to-one correspondence to the memory blocks BLK0 through BLK3, respectively. Each of the main word decoders 10-0 through 10-3 may have the same configuration as the main word decoder 10 shown in FIG. 1. Signals GIDLCTL0 through GIDLCTL3, which correspond to the signal GIDLCTL shown in FIG. 1, are generated by word decoder control circuits 50-0 through 50-3, and are supplied to the main word decoders 10-0 through 10-3, respectively.

The word decoder control circuits 50-0 through 50-3 receive an access indication signal WLSON for activating the main word lines MWL to VPP at the time of access, respective block selection signals BLKSEL0 through SLKSEL3 for selecting a memory block to be accessed at the time of access, a cyclic signal RS asserted at predetermined intervals to reset the main word lines MWL from VPP to VII, and successive-selection signals SR0 through SR3 for successively selecting the memory blocks in which the main word lines MWL are reset from VPP to VII. The successive-selection signals SR0 through SR3 are generated by successive-selection circuits 51-0 through 51-3, respectively.

The access indication signal WLSON for activating the main word lines MWL to VPP at the time of access may be generated by the timing control unit 31, for example. The block-selection signals BLKSEL0 through BLKSEL3 may be generated by decoding the bits of a row address signal indicative of a block address. To be specific, the row decoder 35 may decode a block address to generate the block-selection signals BLKSEL0 through BLKSEL3. The timing control unit 31 may generate the cyclic signal RS asserted at predetermined intervals. The cyclic signal RS may be a refresh timing signal generated by the timing control unit 31.

In the configuration of the present embodiment shown in FIG. 6 and FIG. 7, the main word decoder 10 sets a selected main word line MWL to a first potential (VNN), and sets unselected main word lines MWL to either a second potential (VII) or a third potential (VPP). A cyclic signal generating circuit (i.e., the timing control unit 31) generates the cyclic signal RS that indicates timings at predetermined intervals. A block selecting circuit (i.e., the row decoder 35) selects a memory block to be accessed. The successive-selection circuits 51-0 through 51-3 successively select the memory blocks BLK0 through BLK3 one after another. The word decoder control circuits 50-0 through 50-3 control the main word decoders 10-0 through 10-3 such that at least unselected one of the main word lines MWL of a memory block selected by the block selecting circuit is set to the third potential (VPP), such that the main word lines MWL of the selected memory block are maintained at the third potential (VPP) after an access operation, and such that the main word lines MWL of a memory block currently selected by the successive-selection circuits 51-0 through 51-3 are set to the second potential (VII) at the timings indicated by the cyclic signal RS.

Figure 8:
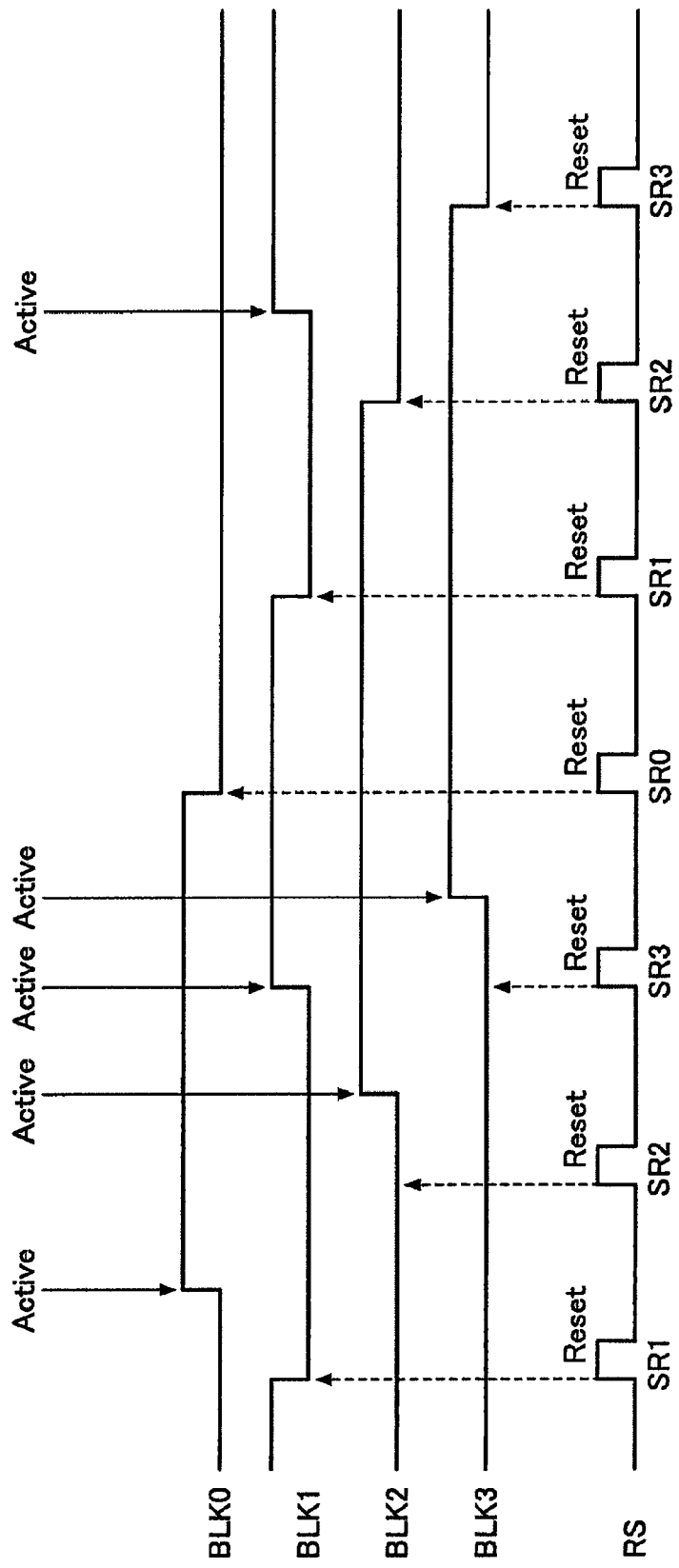
FIG. 8 is a timing chart for explaining the control of main word lines in each memory block by word decoder control circuits.

FIG. 8 is a timing chart for explaining the control of main word lines in each memory block by the word decoder control circuits 50-0 through 50-3. At the timings indicated by arrows accompanying the word "Active", memory blocks indicated by these arrows are activated. To be more specific, a memory block selected by the block-selection signals BLKSEL0 through BLKSEL3 is activated at the timing corresponding to the assertion of the access indication signal WLSON shown in FIG. 7. This activation of a memory block may be initiated in order to perform an access operation responsive to a read command or write command supplied from outside the semiconductor memory device 30, or may be initiated in order to perform an access operation responsive to a refresh command. The refresh command may be either a self-refresh command automatically generated within the semiconductor memory device 30 or a refresh command supplied from outside the semiconductor memory device 30.

The memory blocks BLK0 through BLK3 are reset in response to the cyclic signal RS comprised of pulses appearing at predetermined intervals. In so doing, the memory block to be reset is selected by the successive-selection signals SR0 through SR3 supplied from the successive-selection circuits 51-0 through 51-3, respectively. In FIG. 8, a successive-selection signal placed in the asserted state at the timing of each pulse of the cyclic signal RS is indicated with its signal name (i.e., SR0, SR1, SR2, or SR3) at the bottom of the illustrated pulse. A memory block BLKx is reset when a pulse of the cyclic signal RS appears while SRx (x=0, 1, 2, 3) is asserted. Namely, the potential of all the main word lines MWL of the memory block BLKx is dropped from VPP to VII.

Successive resetting of memory blocks one after another as described above makes it possible to avoid an increase in VII caused by an influx of excessive electric current from VPP to VII, thereby preventing device malfunction. If all the memory blocks BLK0 through BLK3 are reset simultaneously, a large amount of current flows from VPP to VII to cause an increase in VII, which may result in device malfunction.

In the example shown in FIG. 8, for the sake of simplicity of explanation, a memory block is reset if this memory block is in an active state when indicated by the successive-selection signals. In reality, however, the potential of the main word lines MWL should not be dropped from VPP to VII in an active memory block to which a memory access is being made. Accordingly, the word decoder control circuits 50-0 through 50-3 do not reset a memory block selected by the successive-selection signals if this memory block is currently selected by the block selecting signal. The word decoder control circuits 50-0 through 50-3 reset a memory block selected by the successive-selection signals if this memory block is not currently selected by the block selecting signal.

Figure 9:
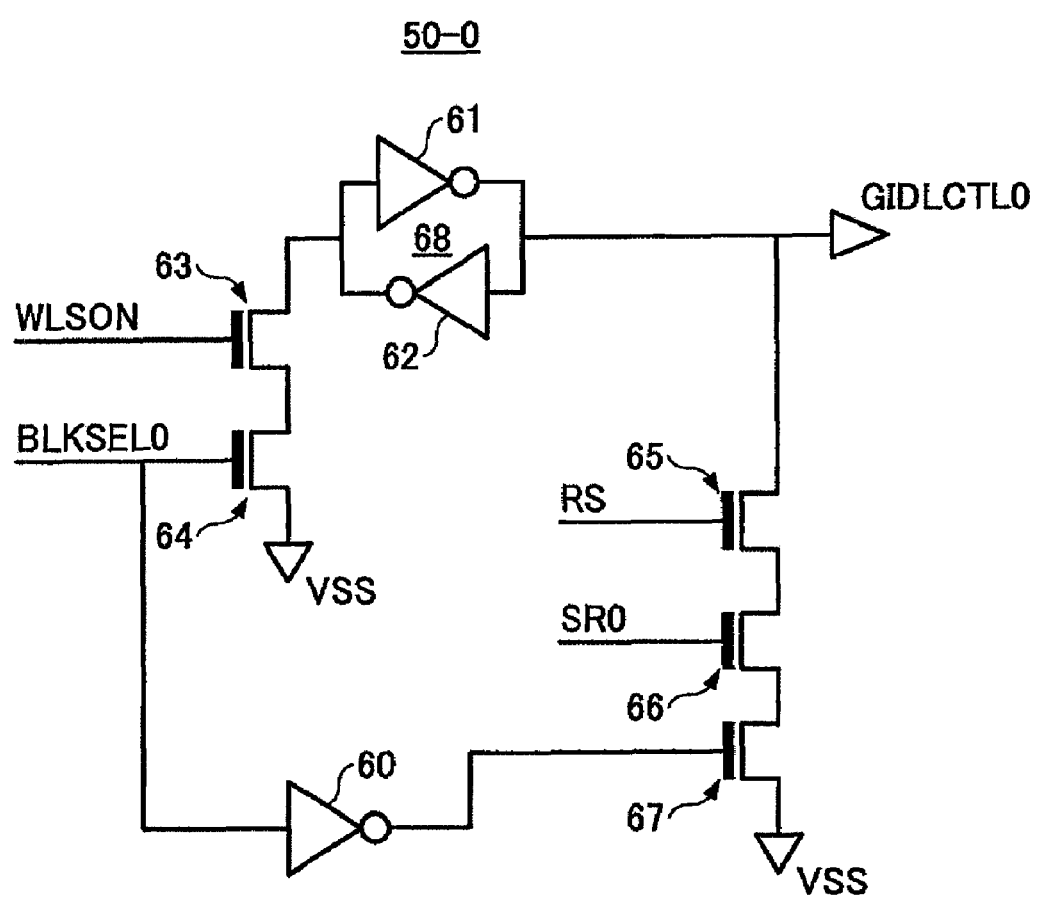
FIG. 9 is a drawing showing an example of the configuration of a word decoder control circuit.

FIG. 9 is a drawing showing an example of the configuration of a word decoder control circuit. FIG. 9 shows the configuration of the word decoder control circuit 50-0. The remaining word decoder control circuits 50-1 through 50-3 have the same configuration.

The word decoder control circuit 50-0 shown in FIG. 9 includes inverters 60 through 62 and NMOS transistors 63 through 67. The inverters 61 and 62 together constitute a latch 68. The latch 68 is set when both the block-selection signal BLKSEL0 and the access indication signal WLSON are asserted to HIGH, resulting in the potential control signal GIDLCTL0 output from the latch 68 being HIGH. The potential level of the unselected main word lines MWL of the main word decoder 10-0 are thus set to VPP.

The potential control signal GIDLCTL0 is set to LOW upon the resetting of the latch 68, so that the potential level of the unselected main word lines MWL of the main word decoder 10-0 is set to VII. All the NMOS transistors 65 through 67 need to become conductive in order to reset the latch 68. The NMOS transistor 67 will never become conductive during the HIGH asserted state of the block-selection signal BLKSEL0, i.e., during the time the memory block BLK0 is an active block subjected to access operation. The latch 68 will never be reset in such a case.

The NMOS transistor 67 becomes conductive when the block-selection signal BLKSEL0 is placed in the LOW negated state, i.e., when the memory block BLK0 is an inactive block. As long as the NMOS transistor 65 or 66 is non-conductive, however, the latch 68 can never be reset. Namely, the potential level of the unselected main word lines MWL of the main word decoder 10-0 are maintained at VPP. When the successive-selection signal SR0 is subsequently set to the HIGH asserted state, and the cyclic signal RS is asserted to HIGH, the NMOS transistors 65 and 66 become conductive to reset the latch 68.

Figure 10:
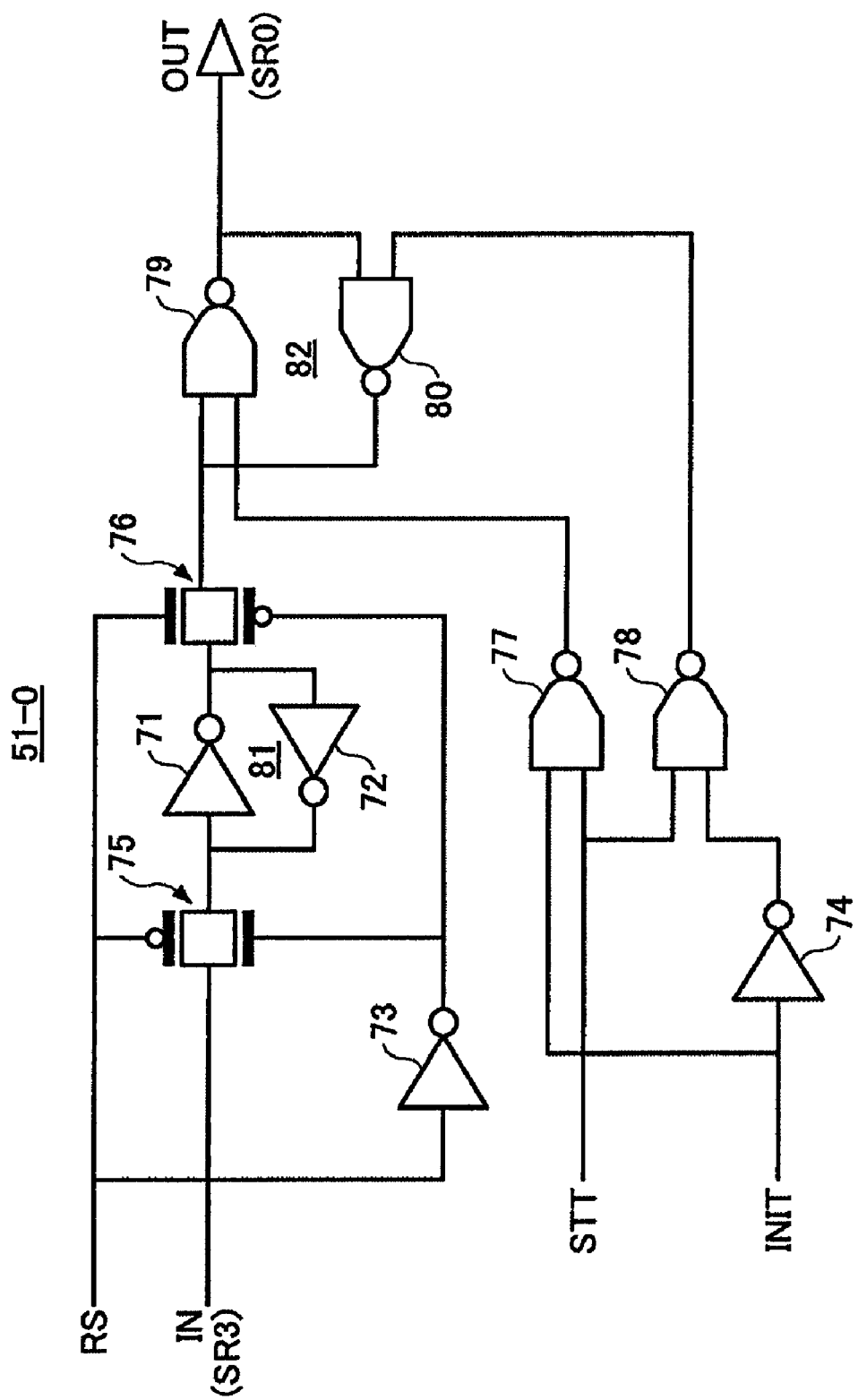
FIG. 10 is a drawing showing an example of the configuration of a successive-selection circuit.

FIG. 10 is a drawing showing an example of the configuration of a successive-selection circuit. FIG. 10 shows the configuration of the successive-selection circuit 51-0. The remaining successive-selection circuits 51-1 through 51-3 have the same configuration.

The successive-selection circuit 51-0 shown in FIG. 10 includes inverters 71 through 74, transfer gates 75 and 76 each comprised of a PMOS transistor and an NMOS transistor connected in parallel, and NAND gates 77 through 80. The inverters 71 and 72 together constitute a latch 81. The NAND gates 79 and 80 together constitute a latch 82.

A signal STT is a power-on indication signal, which is a pulse signal that is set to HIGH for a predetermined duration in response to the power-on of the semiconductor memory device 30. A signal INIT is an initial setting signal. The initial setting signal INIT is set to HIGH in order to initially set to HIGH the successive-selection signal SR0 at the output OUT of the successive-selection circuit 51-0. Upon the HIGH state of the initial setting signal INIT and the HIGH state of the power-on indication signal STT, the output of the NAND gate 77 is set to LOW, so that the latch 82 is placed in such a state that the successive-selection signal SR0 is set to HIGH.

The transfer gate 75 is conductive when the cyclic signal RS is in the LOW negated state, so that the successive-selection signal SR3 at the input IN is supplied to the latch 81. Since only one of the successive-selection signals SR0 through SR3 is set to HIGH in the initial settings, the successive-selection signal SR3 is LOW if the successive-selection signal SR0 is HIGH. Accordingly, the latch 81 is placed in such a state that the output of the inverter 71 is HIGH.

The transfer gate 76 becomes conductive when the cyclic signal RS is placed in the HIGH asserted state, so that the HIGH output of the latch 81 is supplied to the NAND gate 79. In response, the latch 82 is placed in such a state that the successive-selection signal SR0 is LOW.

When the successive-selection signal SR3 output from the successive-selection circuit 51-3 (see FIG. 7) is set to HIGH while the cyclic signal RS is in the LOW negated state, the latch 81 is set such that the output of the inverter 71 is set to LOW. The transfer gate 76 subsequently becomes conductive when the cyclic signal RS is placed in the HIGH asserted state, so that the LOW output of the latch 81 is supplied to the NAND gate 79. In response, the latch 82 is placed in such a state that the successive-selection signal SR0 is HIGH.

As shown in FIG. 7, the output OUT of a given stage of the successive-selection circuits 51-0 through 51-3 is connected to the input of the next stage of the successive-selection circuits 51-0 through 51-3. The successive-selection circuits 51-0 through 51-3 thus constitute a shift register for which the cyclic signal RS serves as a synchronizing signal. This shift register can successively select the memory blocks BLK0 through BLK3 one after another.

Figure 11:
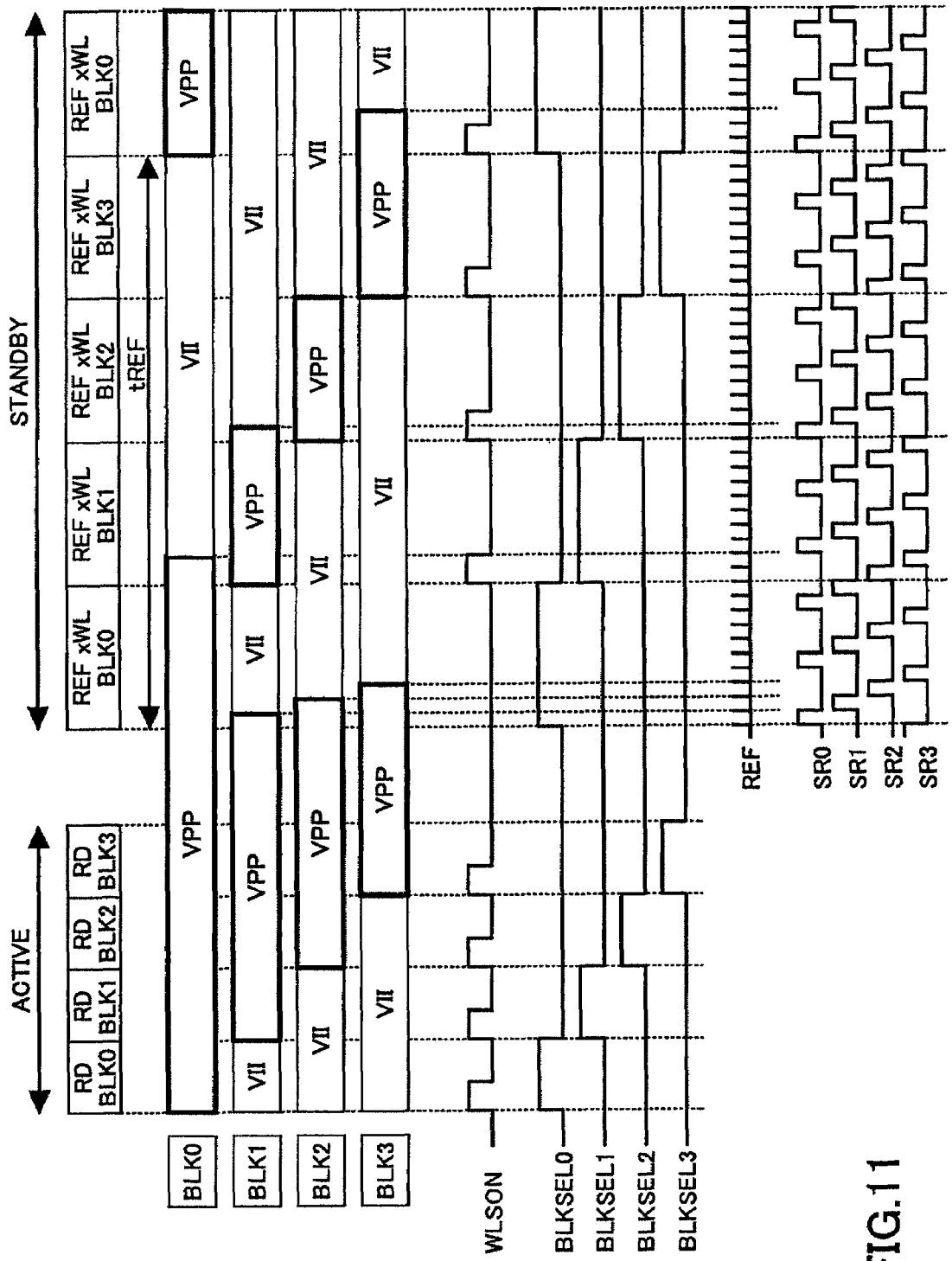
FIG. 11 is a drawing for explaining the dropping of the potential of main word lines with respect to each memory block according to the present embodiment.

FIG. 11 is a drawing for explaining the dropping of the potential of the main word lines MWL with respect to each memory block according to the present embodiment. FIG. 11 illustrates an example in which 4 memory blocks BLK0 through BLK3 are provided. An active period for memory access appears first, followed by a standby period in which no memory access is performed. Each row in FIG. 11 shows whether the potential of the main word lines MWL are VPP or VII with respect to a corresponding one of the memory blocks BLK0 through BLK3. Further, the example shown in FIG. 11 is directed to a case in which a refresh timing signal REF is used as the cyclic signal RS.

In FIG. 11, a first access operation in the active period is a read operation (RD-BLK0) with respect to the memory block BLK0. The potential of the main word lines MWL of the memory block BLK0 is set to VPP in response to the simultaneous occurrence of a HIGH asserting pulse of the access indication signal WLSON and a HIGH asserting pulse of the block-selection signal BLKSEL0. After this access operation, the potential of the main word lines MWL of the memory block BLK0 is maintained at VPP. A second access operation in the active period is a read operation (RD-BLK1) with respect to the memory block BLK1. The potential of the main word lines MWL of the memory block BLK1 is set to VPP in response to the simultaneous occurrence of a HIGH asserting pulse of the access indication signal WLSON and a HIGH asserting pulse of the block-selection signal BLKSEL1. After this access operation, the potential of the main word lines MWL of the memory block BLK1 is maintained at VPP. By the same token, access operations are successively performed with respect to each of the memory blocks BLK2 and BLK3, resulting in the main word lines MWL being maintained at VPP in all the memory blocks BLK0 through BLK3.

In the standby period, the memory blocks BLK0 through BLK3 are successively refreshed. This may be a refresh operation automatically performed within the DRAM. In a period designated as REFxWL-BLK0, all the sub-word lines SWL are successively selected and refreshed in the memory block BLK0. In a period designated as REFxWL-BLK1, also, all the sub-word lines SWL are successively selected and refreshed in the memory block BLK1. The same also applies in the case of the memory blocks BLK2 and BLK3.

In the example shown in FIG. 11, the refresh timing signal REF is used as the cyclic signal RS, so that the memory blocks BLK0 through BLK3 are successively reset at the timings indicated by respective pulses of the refresh timing signal REF. At the timing corresponding to the first pulse of the refresh timing signal REF immediately following the start of the standby period, the successive-selection signal SR0 is in the HIGH asserted state, so that the memory block BLK0 is selected as the candidate of reset operation. Since the memory block BLK0 is selected at this point in time as an active memory block for access operation by the block-selection signal BLKSEL0, the memory block BLK0 is not reset. Namely, the potential of all the main word lines MWL of the memory block BLK0 is not dropped from VPP to VII.

At the timing corresponding to the second pulse of the refresh timing signal REF, the successive-selection signal SR1 is in the HIGH asserted state, so that the memory block BLK1 is selected as the candidate of reset operation. Since the memory block BLK0 is selected at this point in time as an active memory block for access operation by the block-selection signal BLKSEL0, the memory block BLK1 is reset. Namely, the potential of all the main word lines MWL of the memory block BLK1 is dropped from VPP to VII.

At the timing corresponding to the third pulse of the refresh timing signal REF, the successive-selection signal SR2 is in the HIGH asserted state, so that the memory block BLK2 is selected as the candidate of reset operation. Since the memory block BLK0 is selected at this point in time as an active memory block for access operation by the block-selection signal BLKSEL0, the memory block BLK2 is reset. Namely, the potential of all the main word lines MWL of the memory block BLK2 is dropped from VPP to VII.

By the sake token, at the timing corresponding to the third pulse of the refresh timing signal REF, the potential of all the main word lines MWL of the memory block BLK3 is dropped from VPP to VII. Successive resetting of memory blocks one after another as described above makes it possible to avoid an increase in VII caused by an influx of excessive electric current from VPP to VII, thereby preventing device malfunction.

When all the sub-word lines SWL are successively selected and refreshed in the memory block BLKx in a period designated as REFxWL-BLKx (x=0, 1, 2, 3), the potential of the main word lines MWL is thereafter maintained at VPP. When a memory block of interest is selected by the successive-selection signals, all the main word lines MWL of this memory block are set to VII upon the occurrence of a pulse of the refresh timing signal REF.

In the operation of the present embodiment shown in FIG. 11, the time length during which the main word lines MWL of a memory block is maintained at VPP in the standby period is extremely short, compared with the configuration shown in FIG. 4 in which the potential of the word lines of a given memory block is dropped from VPP to VII upon the completion of refresh operation of this memory block. Accordingly, the effect of reducing current consumption resulting from leak currents is sufficient.

In order to provide a difference in such an advantageous effect between FIG. 4 and FIG. 11, the intervals of timings (i.e., pulses) indicated by the reset-purpose cyclic signal RS are preferably shorter than the time length required to refresh the entirety of a single memory block. If the pulse intervals of the reset-purpose cyclic signal RS are compatible with the time length required to refresh the entirety of a single memory block, the operation of the present embodiment becomes substantially the same as the operation shown in FIG. 4. Namely, the cyclic signal RS should be a proper timing signal that can prevent the current consumption associated with the lifting of the potential of main word lines MWL as much as possible while maintaining the effect of leak current reduction. To be specific, the pulse interval is preferably sufficiently longer than the intervals between access operations, and is preferably sufficiently shorter than the time length required to refresh the entirety of a single memory block. In order to provide a difference in the advantageous effect between FIG. 4 and FIG. 11, further, the successive-selection signals for selecting a memory block to be reset are preferably those signals which can select a memory block independently of the block selecting signal for selecting a memory block to be accessed.

Figure 12:
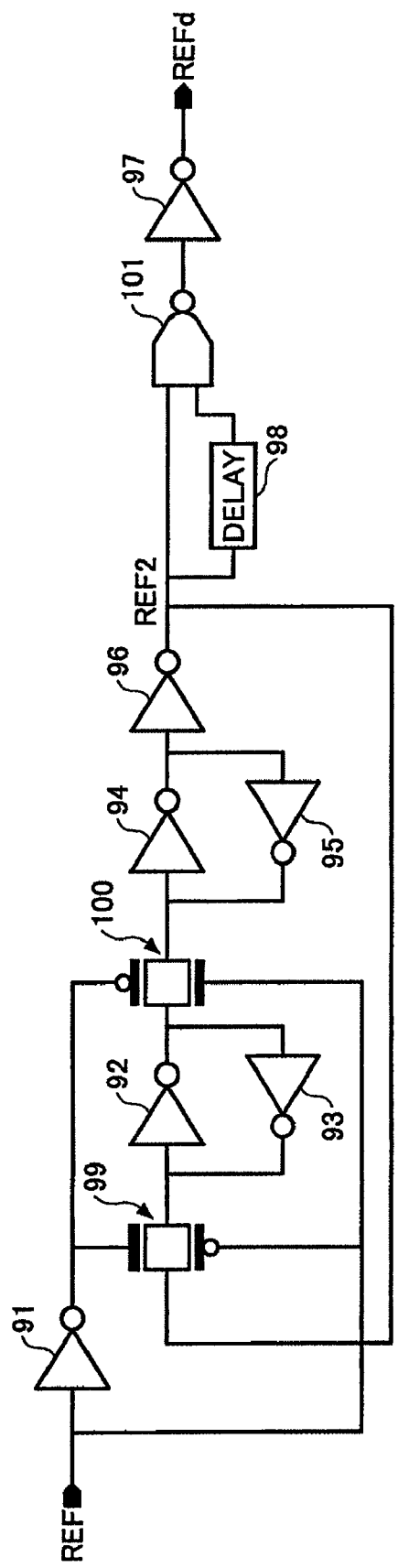
FIG. 12 is a circuit diagram showing an example of the configuration for generating a cyclic signal in response to a refresh timing signal for requesting refresh operations.

FIG. 12 is a circuit diagram showing an example of the configuration for generating the cyclic signal RS in response to a refresh timing signal for requesting refresh operations. In the embodiment previously described, the refresh timing signal REF is used as the cyclic signal RS. Alternatively, a signal generated in response to the refresh timing signal REF may be used as the cyclic signal RS.

The circuit shown in FIG. 12 includes inverters 91 through 97, a delay circuit 98, transfer gates 99 and 100 each comprised of a PMOS transistor and an NMOS transistor connected in parallel, and a NAND gate 101. The circuit shown in FIG. 12 serves as a frequency divider to generate a half-frequency signal REF2 in response to the refresh timing signal REF. The half-frequency signal REF2 is supplied to a rising edge detecting circuit comprised of the delay circuit 98, the NAND circuit 101, and the inverter 97. The rising edge detecting circuit generates a pulse signal REFd that appears at the rising edges of the half-frequency signal REF2.

Figure 13:
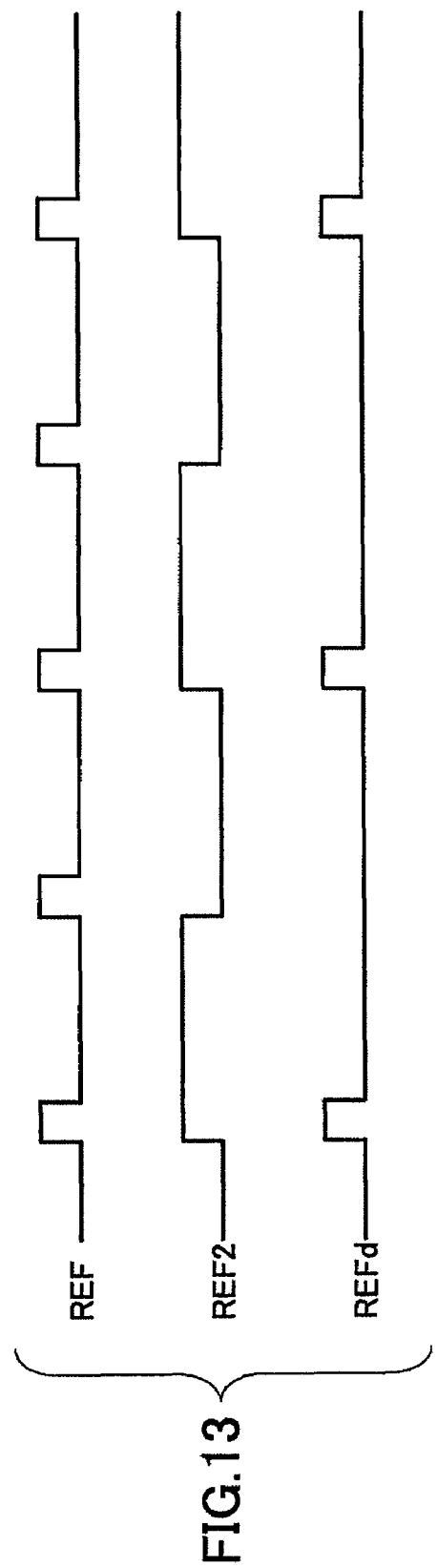
FIG. 13 is a drawing for explaining the operation of the circuit shown in FIG. 12.

FIG. 13 is a drawing for explaining the operation of the circuit shown in FIG. 12. As shown in FIG. 13, the half-frequency signal REF2 is generated by dividing the frequency of the refresh timing signal REF by 2. Pulses are then generated at the rising edges of the half-frequency signal REF2 to create the signal REFd in which pulses are arranged at predetermined intervals. The signal REFd generated in this manner may be used as the cyclic signal RS described above.

Although a half-frequency signal is used in the example shown in FIG. 12 and FIG. 13, this is not intended to be a limiting example. A ¼-frequency-division signal, for example, may alternatively be used. As previously described, a proper timing signal may be used as the cyclic signal RS by striking a balance between the effect of leak current reduction and the current consumption associated with the lifting of the potential of main word lines.

Further, the present invention is not limited to these embodiments, but various variations and modifications may be made without departing from the scope of the present invention.

What is claimed is:

1. A semiconductor memory device comprising:
    a plurality of memory blocks each including main word lines and sub-word lines;
    a main word decoder configured to set a selected main word line to a first potential and to set an unselected main word line to one of a second potential and a third potential;
    a cyclic signal generating circuit configured to generate a cyclic signal that indicates timing at predetermined intervals;
    a block selecting circuit configured to select a memory block to be accessed;
    a successive-selection circuit configured to successively select the memory blocks one after another; and
    a word decoder control circuit configured to control the main word decoder such that at least unselected one of the main word lines of a memory block selected by the block selecting circuit is set to the third potential, such that the main word lines of the selected memory block are maintained at the third potential after an access operation, and such that the main word lines of a memory block being selected by the successive-selection circuit are set to the second potential at the timing indicated by the cyclic signal.

2. The semiconductor memory device according to claim 1, wherein the word decoder control circuit is configured such that if the memory block being selected by the successive-selection circuit is being selected by the block selecting circuit, the main word lines of the memory block being selected by the successive-selection circuit are not set to the second potential at the timing indicated by the cyclic signal, and such that if the memory block being selected by the successive-selection circuit is not being selected by the block selecting circuit, the main word lines of the memory block being selected by the successive-selection circuit are set to the second potential at the timing indicated by the cyclic signal.

3. The semiconductor memory device according to claim 1, wherein the predetermined intervals at which the timing is indicated by the cyclic signal is shorter than a time length required to refresh an entirety of one of the memory blocks.

4. The semiconductor memory device according to claim 1, wherein the cyclic signal is a refresh timing signal requesting refresh operations.

5. The semiconductor memory device according to claim 1, wherein the cyclic signal is a signal generated in response to a refresh timing signal requesting refresh operations.

6. The semiconductor memory device according to claim 1, wherein the second potential is between the first potential and the third potential.

7. The semiconductor memory device according to claim 5, further comprising a sub-word decoder including a transistor having a channel and a gate node, a first end of the channel being connected to a sub-word line, and the gate node being connected to a corresponding main word line, wherein a second node of the channel is set to the third potential upon selection of the sub-word decoder.

8. The semiconductor memory device according to claim 1, wherein the successive-selection circuit newly selects one of the memory blocks different from a currently selected one at each timing indicated by the cyclic signal.

9. The semiconductor memory device according to claim 8, wherein the successive-selection circuit includes a shift register operating in synchronization with the cyclic signal.

10. The semiconductor memory device according to claim 1, wherein the successive-selection circuit is configured to select a memory block independently of the block selection operation performed by the block selecting circuit.

11. The semiconductor memory device according to claim 1, wherein the successive-selection circuit is configured to select a predetermined one of the memory blocks in an initial state.

12. The semiconductor memory device according to claim 1, wherein the main word decoder is configured to set the main word lines to one of the second potential and the third potential on a memory-block-specific basis in response to a potential control signal that is memory-block specific, wherein the word decoder control circuit includes latches provided in one-to-one correspondence to the memory blocks, the potential control signal being generated in response to data stored in a corresponding one of the latches.

13. The semiconductor memory device according to claim 12, wherein one of the latches is set by a signal from the block selecting circuit, and is reset by the cyclic signal upon indication of the timing by the cyclic signal while a memory block corresponding to said one of the latches is being selected by the successive-selection circuit.

14. A method of controlling a word decoder in a semiconductor memory device including a plurality of memory blocks each including main word lines and sub-word lines, a main word decoder configured to set a selected main word line to a first potential and to set an unselected main word line to one of a second potential and a third potential, and a block selecting circuit configured to select a memory block to be accessed, said method comprising:
generating a cyclic signal that indicates timing at predetermined intervals;
generating a successive-selection signal that successively selects the memory blocks one after another; and
controlling the main word decoder such that at least unselected one of the main word lines of a memory block selected by the block selecting circuit is set to the third potential, such that the main word lines of the selected memory block are maintained at the third potential after an access operation, and such that the main word lines of a memory block being selected by the successive-selection signal are set to the second potential at the timing indicated by the cyclic signal.

15. The method according to claim 14, wherein the step of controlling the main word decoder performs control such that if the memory block being selected by the successive-selection signal is being selected by the block selecting circuit, the main word lines of the memory block being selected by the successive-selection signal are not set to the second potential at the timing indicated by the cyclic signal, and such that if the memory block being selected by the successive-selection signal is not being selected by the block selecting circuit, the main word lines of the memory block being selected by the successive-selection signal are set to the second potential at the timing indicated by the cyclic signal.

16. The method according to claim 14, wherein the predetermined intervals at which the timing is indicated by the cyclic signal is shorter than a time length required to refresh an entirety of one of the memory blocks.

17. The method according to claim 14, wherein the cyclic signal is a refresh timing signal requesting refresh operations.

18. The method according to claim 14, wherein the cyclic signal is a signal generated in response to a refresh timing signal requesting refresh operations.

19. The method according to claim 14, wherein the second potential is between the first potential and the third potential.

* * * * *